United States Patent
Kim et al.

(10) Patent No.: US 7,639,771 B2
(45) Date of Patent: Dec. 29, 2009

(54) MEMORY DEVICE WITH EXTERNAL MAGNETIC FIELD GENERATOR AND METHOD OF OPERATING AND MANUFACTURING THE SAME

(75) Inventors: Tae-wan Kim, Gyeonggi-do (KR); In-jun Hwang, Gyeonggi-do (KR); Won-cheol Jeong, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 240 days.

(21) Appl. No.: 11/363,244

(22) Filed: Feb. 28, 2006

(65) Prior Publication Data

US 2006/0198182 A1 Sep. 7, 2006

(30) Foreign Application Priority Data

Mar. 2, 2005 (KR) .................. 10-2005-0017217

(51) Int. Cl.
*G11C 11/14* (2006.01)

(52) U.S. Cl. .................. 376/171; 365/33; 365/22; 365/97; 365/173

(58) Field of Classification Search .................. 365/33, 365/22, 97, 171, 173

See application file for complete search history.

(56) References Cited

U.S. PATENT DOCUMENTS

| | | | | |
|---|---|---|---|---|
| 6,404,671 B1 * | 6/2002 | Reohr et al. | ................. | 365/158 |
| 6,611,454 B2 * | 8/2003 | Hidaka | ................. | 365/171 |
| 6,621,731 B2 * | 9/2003 | Bessho et al. | ................. | 365/171 |
| 7,136,298 B2 * | 11/2006 | Frey | ................. | 365/158 |
| 7,257,018 B2 * | 8/2007 | Ho et al. | ................. | 365/158 |
| 2002/0176277 A1 * | 11/2002 | Bessho et al. | ................. | 365/171 |
| 2004/0037110 A1 * | 2/2004 | Ooishi | ................. | 365/171 |
| 2004/0047177 A1 * | 3/2004 | Fukuzumi | ................. | 365/157 |
| 2004/0160822 A1 * | 8/2004 | Ooishi | ................. | 365/171 |
| 2004/0196693 A1 * | 10/2004 | Iwata | ................. | 365/158 |
| 2005/0002229 A1 * | 1/2005 | Matsutera et al. | ................. | 365/171 |
| 2005/0146967 A1 * | 7/2005 | Park et al. | ................. | 365/222 |
| 2005/0242384 A1 * | 11/2005 | Iwata et al. | ................. | 257/296 |

* cited by examiner

*Primary Examiner*—Thong Q Le
(74) *Attorney, Agent, or Firm*—Harness, Dickey & Pierce, P.L.C.

(57) ABSTRACT

A memory device with a magnetic field generator and method of operating and manufacturing the same. In the device and method, a magnetic memory may includes a magnetic tunneling junction (MTJ) cell, a transistor, and a bit line, and a magnetic field generator external to the magnetic memory to generate a global magnetic field toward the magnetic memory in a parallel direction to the bit line.

23 Claims, 9 Drawing Sheets

MEMORY DEVICE WITH EXTERNAL MAGNETIC FIELD GENERATOR AND METHOD OF OPERATING AND MANUFACTURING THE SAME

PRIORITY STATEMENT

This application claims the benefit of Korean Patent Application No. 10-2005-0017217, filed on Mar. 2, 2005, in the Korean Intellectual Property Office, the disclosure of which is incorporated herein in its entirety by reference.

BACKGROUND OF THE INVENTION

1. Field of the Invention

Example embodiments of the present invention relate to a memory device, and more particularly, to a memory device with an external magnetic field generator and method of operating and manufacturing the same.

2. Description of the Related Art

Magnetic memory devices, together with ferroelectric random access memory (FRAM) devices, parameter random access memory (PRAM) devices, and redundant random access memory (RRAM) devices, are considered to be the next generation of non-volatile memory devices. A magnetic memory cell may include a field effect transistor (FET) as a switching unit and a magnetic tunnelling junction (MTJ) cell. Such a magnetic memory device is characterized by the MTJ cell. The MTJ cell may include a lower magnetic layer of which magnetization orientation is fixed, an upper magnetic layer (free magnetic layer) of which magnetization orientation may be changed by an external magnetic field, and a tunnelling layer interposed between the lower and the upper magnetic layers.

In a conventional MTJ cell of a magnetic memory device, the magnetic orientation of the free magnetic layer is determined by a vector combination of a magnetic field generated by a bit line in a first (for example, an easy) axis direction and a magnetic field generated by a digit line in a second (for example, a hard) axis direction, where the bit line and the digit line are perpendicular to each other. Because the free magnetic layer has a residual magnetization, the free layer may maintain its magnetization orientation even when the magnetic memory device is powered-off after the magnetic orientation of the free magnetic layer is determined. That is, because the magnetization orientation of the free magnetic layer means stored data, the data in the MTJ cell may be retained even when not powered.

Magnetic memory devices have advantages, for example, a good non-volatile characteristic and a simple structure suitable for memory integration. However, the MTJ cell of the magnetic memory device should have a large magnetic resistance ratio (MR ratio) to secure a sufficient sensing margin. Also, the magnetic coupling between the lower magnetic layer and the free magnetic layer should be reduced. Specifically, cell selectivity may be reduced as the integration level of the memory device increases. That is, because the distances between the MTJ cells of the magnetic memory device become smaller as the integration level increases, non-selected MTJ cells around a selected MTJ cell may be affected by the magnetic field of the bit line. Therefore, the data in the non-selected MTJ cells may be overwritten, deleted, or destroyed.

To obviate this problem, a magnetic memory device utilizing a local field has been introduced. This type of magnetic memory device is capable of concentrating the local field on a selected MTJ cell to prevent non-selected MTJ cells from being affected by the local magnetic field, thereby increasing the cell selectivity.

The local field type magnetic memory device, however, has a drawback in that the coercivity of the MTJ cell is increased when the distance between the MTJ cells decreases as the integration level of the magnetic memory increases. That is, a larger current is required to write data on or delete data from a selected MTJ cell. Further, the size of a transistor reduces as the integration level of the magnetic memory device increases and thereby the current limit of the transistor also reduces. Therefore, the write current of the MTJ cell is limited to the current limit of the transistor.

Further, when the MTJ cell is larger than 0.4 $\mu m$ (when the integration level of the local field type magnetic memory device is lower than 4 MB), the effect of the local field is reduced. Therefore, a large current is also required in this case.

As described above, because the local field magnetic memory device requires a large current in both cases, e.g. when its integration level is high and low, an additional digit line may be required to lower the current.

However, many additional processes may be required to add the digit line to the magnetic memory device, thereby decreasing manufacturing productivity thereof. Also, the power consumption of the magnetic memory device increases because a current must be applied to both the bit line and digit line.

SUMMARY OF THE INVENTION

Example embodiments of the present invention provide a memory device with an external magnet field generator.

Example embodiments of the present invention provide a memory device that reduces power consumption and/or prevents the increase of both the coercivity when the integration of the device is high and the switch current when the integration of the device is low.

Example embodiments of the present invention provide a method of operating the memory device.

Example embodiments of the present invention provide a method of manufacturing the memory device.

According to an example embodiment of the present invention, a memory device may include a magnetic memory including an MTJ (magnetic tunneling junction) cell, a transistor, and a bit line and a magnetic field generator external to the magnetic memory to generate a global magnetic field toward the magnetic memory in a parallel direction to the bit line.

In an example embodiment, the magnetic memory may include a cell array with a plurality of magnetic memory cells that are connected by the bit line, each of the magnetic memory cells including the MTJ cell and the transistor.

In an example embodiment, each of the magnetic memory cells may further include a lower electrode connecting the MTJ cell with the transistor; and an upper electrode facing the lower electrode and connecting the MTJ cell with the bit line, wherein the MTJ cell may be disposed between the lower and the upper electrodes, and the upper electrode connected to the bit line may be spaced apart from the bit line such that a magnetic field generated from the bit line toward the MTJ cell is negligible.

In an example embodiment, the magnetic field generator may be perpendicular to the bit line and include a first magnet having an N-pole surface facing the magnetic memory; and a second magnet having an S-pole surface facing the magnetic memory and wherein the second magnet faces the first magnet with the magnetic memory therebetween.

In an example embodiment, the first and the second magnets may be permanent magnets.

According to another example embodiment of the present invention, there is provided a method of operating a memory device that includes a magnetic memory and a magnetic field generator, the magnetic memory including an MTJ cell, a transistor, and a bit line, the magnetic field generator external to the magnetic memory to generate a magnetic field toward magnetic memory in a parallel direction to the bit line, the method including writing data in the magnetic memory by applying a write current to a bit line when the magnetic memory is in a magnetic field generated by the magnetic field generator.

In an example embodiment, the transistor may be kept in an off-state.

In an example embodiment, the magnetic memory may include a cell array with a plurality of magnetic memory cells as described above.

In an example embodiment, each of the magnetic memory cells may further include the same elements as described above, and in this case the transistor may be kept in an on-state.

In an example embodiment, the magnetic field generator may be the same as the described above.

According to another example embodiment of the present invention, there is provided a method of operating a memory device that includes a magnetic memory and a magnetic field generator, the magnetic memory including an MTJ cell, a transistor, and a bit line, the magnetic field generator external to the magnetic memory to generate a magnetic field toward magnetic memory in a parallel direction to the bit line, the method including turning on the transistor and applying a read current to the bit line to read data from the magnetic memory, the read current being smaller than a write current of the bit line.

In an example embodiment, the magnetic memory may include a cell array with a plurality of magnetic memory cells as described above, and each of the magnetic memory cells may further include the same elements as described above.

In an example embodiment, the magnetic field generator may be the same as the described above.

According to another example embodiment of the present invention, there is provided a method of manufacturing a memory device, including forming a transistor on a substrate, forming an MTJ cell in connection with the transistor, forming a bit line in connection with the MTJ cell, and disposing a magnetic field generator external to the MTJ cell to generate a global magnetic field that passes through the MTJ cell in a direction parallel to the bit line.

In an example embodiment, the magnetic field generator may be disposed at each side of a cell array with a plurality of memory cells, and each of the memory cells may include the transistor, the MTJ cell, and the bit line that are formed by the above operations.

In an example embodiment, the method may further include forming a lower electrode to connect the transistor with the MTJ cell and generate a local magnetic field for the MTJ cell. Also, the method may further include forming an upper electrode to connect the bit line with the MTJ cell and generate a local magnetic field for the MTJ cell.

In an example embodiment, the magnetic field generator may be perpendicular to the bit line and include a first magnet having an N-pole surface facing the magnetic memory; and a second magnet having an S-pole surface facing the magnetic memory wherein the second magnet faces the first magnet with the magnetic memory therebetween.

In an example embodiment, the first and the second magnets may be permanent magnets.

BRIEF DESCRIPTION OF THE DRAWINGS

The above and other features and advantages of the present invention will become more apparent by describing in detail example embodiments thereof with reference to the attached drawings in which.

DETAILED DESCRIPTION OF EXAMPLE EMBODIMENTS OF THE INVENTION

Figure 1:
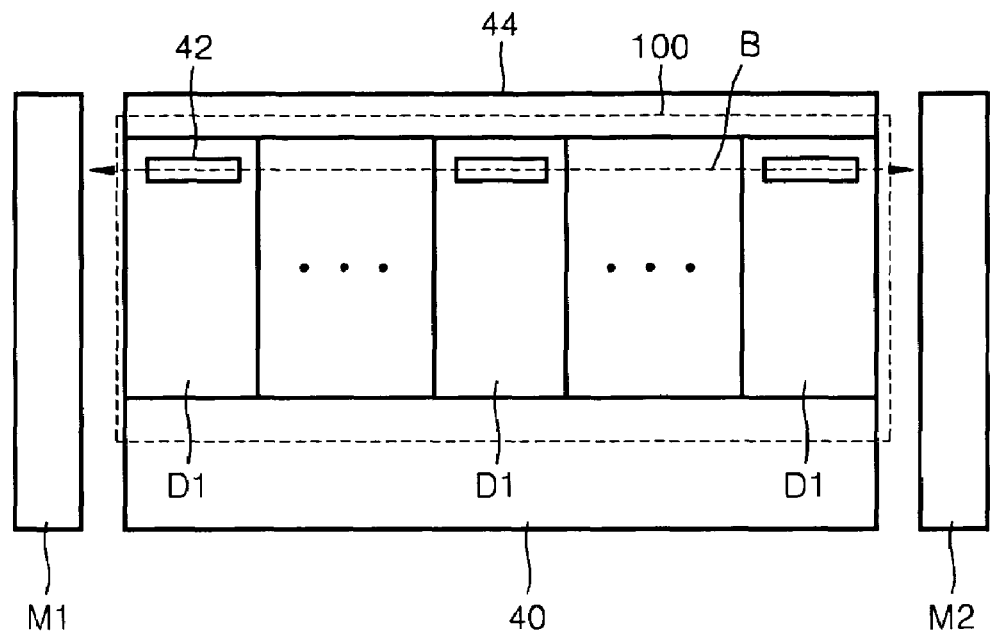
FIG. 1 is a cross-sectional view of a memory device with a magnetic field generator according to an example embodiment of the present invention.

The present invention will now be described more fully with reference to accompanying drawings, in which example embodiments of the present invention are shown. In the drawings, the thickness of layers and regions are exaggerated for clarity.

Various example embodiments of the present invention will now be described more fully with reference to the accompanying drawings in which some example embodiments of the invention are shown. In the drawings, the thicknesses of layers and regions are exaggerated for clarity.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

It will be understood that when an element or layer is referred to as being "formed on" another element or layer, it can be directly or indirectly formed on the other element or layer. That is, for example, intervening elements or layers may be present. In contrast, when an element or layer is referred to as being "directly formed on" to another element, there are no intervening elements or layers present. Other words used to describe the relationship between elements or layers should be interpreted in a like fashion (e.g., "between" versus "directly between", "adjacent" versus "directly adjacent", etc.).

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

A memory device according to an example embodiment of the present invention will now be described.

Figure 2:
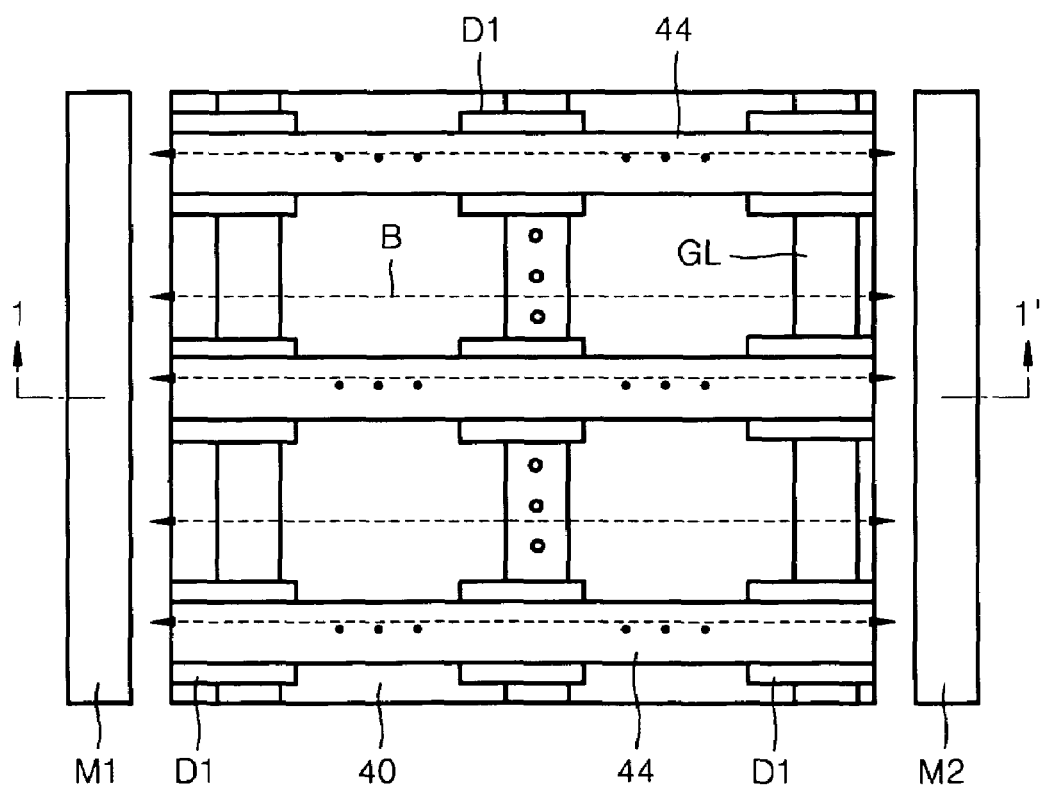
FIG. 2 is a plan view of a memory device with a magnetic field generator according to an example embodiment of the present invention.

FIGS. 1 and 2 are a sectional view and a plan view of a memory device with a magnetic field generator, respectively, according to the present invention. FIG. 1 is a section taken along line 1-1', in which a gate line shown in FIG. 2 is omitted for clarity.

Referring to FIGS. 1 and 2, a cell array 100 with a plurality of memory cells D1 may be formed on a semiconductor substrate 40. Reference numeral 42 denotes a magnetic tunneling junction (MTJ) cell included in the memory cell D1. The MTJ cells 42 of the memory cells D1 may be connected by bit lines 44. External to the cell array 100, a first magnet M1 and a second magnet M2 may be disposed, for example, at opposing sides of the cell array 100 and may face each other. The first and second magnets M1 and M2 may be used to generate a global magnetic field (B) in a direction parallel to the bit lines 44. The global magnetic field (B) may be applied parallel to a first axis, for example, a hard axis of the MTJ cell 42. The first magnet M1 and the second magnet M2 may be permanent magnets. The direction of the global magnetic field (B) may be reversed depending on the polarities of the opposing surfaces of the first and the second magnets M1 and M2. That is, the first magnet M1 may have an N pole at one side (a first surface) facing the cell array 100 when the second magnet M2 has an S pole at one side (a second surface) facing the cell array 100, and vice versa.

Though the first and second magnets M1 and M2 may be provided for the plurality of bit lines 44 as shown in FIG. 2, first and the second magnets M1 and M2 may be provided individually for each bit line 44. In an example embodiment, the number of magnet pairs M1, M2 may be the same as the number of the bit lines 44.

Each memory cell D1 may include an MTJ cell 42 and a field effect transistor (FET). Other elements of the memory cell D1 may be varied as shown in FIGS. 3 and 4.

Figure 3:
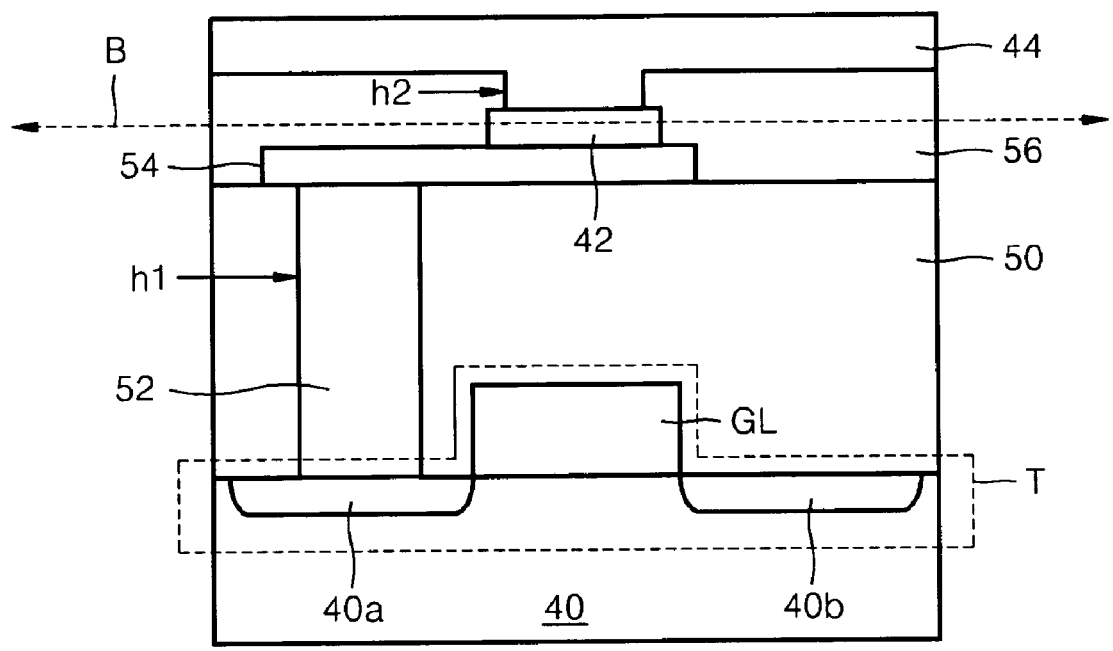
FIGS. 3 and 4 are example views showing structures of magnetic memory cells of the memory device depicted in FIG. 1.

Referring to FIG. 3, the memory cell D1 may include a FET (T) formed on the substrate 40. The FET (T) may include a first impurity doped region 40a, a second impurity doped region 40b, and a gate line GL. The first impurity doped region 40a and the second impurity doped region 40b may be a source region and a drain region, respectively. An interlayer insulating layer 50 may be formed on the substrate 40 to cover the FET (T). The interlayer insulating layer 50 may define a contact hole h1 to expose the first impurity doped region 40a. The contact hole h1 may be filled with a conductive plug 52. A conductive pad 54 may be formed on the interlayer insulating layer 50 that is connected with the conductive plug 52. The conductive pad 54 may extend over the gate line GL. The MTJ cell 42 may be located on a specific portion of the conductive pad 54 and aligned with the gate line GL. An insulating layer 56 may be formed on the interlayer insulating layer 50 to cover the conductive pad 54 and the MTJ cell 42. The insulating layer 56 may define a via hole h2 to expose the MTJ cell 42. The bit line 44 may be formed on the insulating layer 56 and may be connected with the MTJ cell 42 through the via hole h2.

Figure 4:
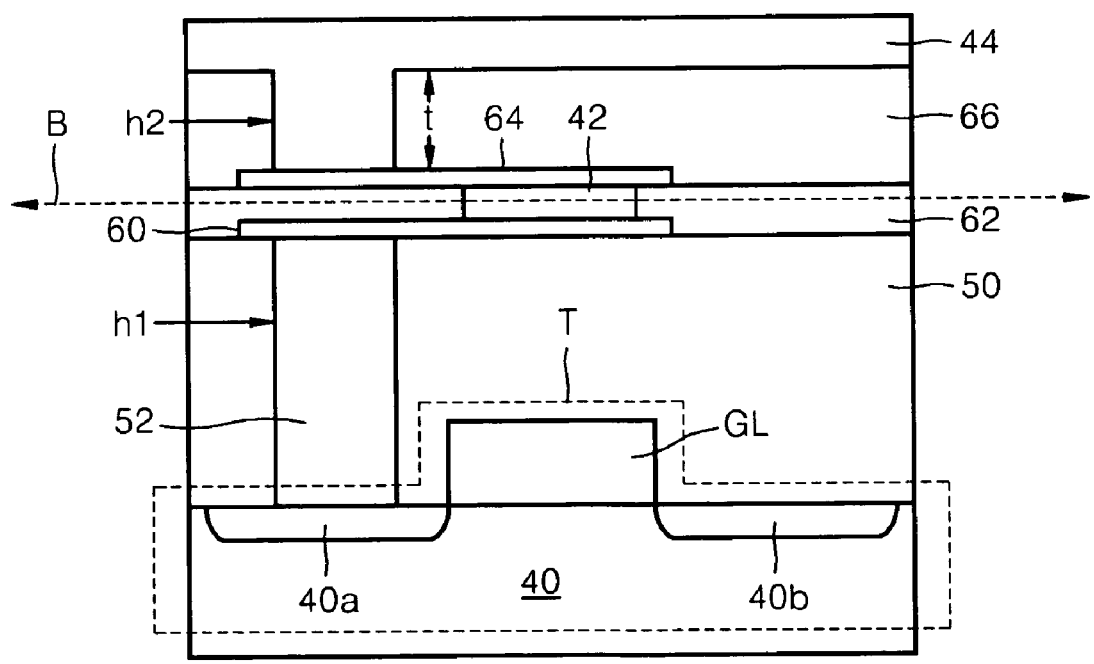

Referring to FIG. 4, the memory cell D1 may include a lower electrode 60 on the interlayer insulating layer 50. The lower electrode 60 may extend over the gate line GL. The MTJ cell 42 may be formed on a portion of the lower electrode 60. The MTJ cell 42 may be spaced apart from the conductive plug 52. When a current flows through the lower electrode 60, a local magnetic field may be generated around the lower electrode 60 to affect the MTJ cell 42. A first insulating layer 62 may be formed on the interlayer insulating layer 50 to cover the lower electrode 60 and enclose the MTJ cell 42. An upper electrode 64 may be formed on the first insulating layer 62 to contact a top of the MTJ cell 42. The upper electrode 64 may face the lower electrode 60. When a current flows through the upper electrode 64, a local magnetic field is generated around the upper electrode 64 to affect the MTJ cell 42. The local magnet fields may be perpendicular to the global magnetic field (B) generated by the first and the second magnets M1 and M2, and the magnetization orientation of the MTJ cell 42 may be determined by the resulting magnetic field of the local magnet fields and the global magnetic field (B). A second insulating layer 66 may be formed on the first insulating layer 62 to cover the upper electrode 64. The second insulating layer 66 may be made of the same material as the first insulating layer 62. The second insulating layer 66 may define a via hole h2 to expose the upper electrode 64. The via hole h2 may be spaced apart from the MTJ cell 42. The bit line 44 may be formed on the second insulating layer 66 and connected with the upper electrode 64 through the via hole h2. A distance (t) between the upper electrode 64 and the bit line 44 may be adjusted to reduce or prevent the magnetic field generated by the bit line 44 from affecting the MTJ cell 42.

An experiment was carried out to examine the switching characteristics of the memory device in accordance with example embodiments of the present invention. The experiment was carried out on a plurality of magnetic memory samples, and each sample was provided with a digit line to compare a magnetic field generated by a digit line (hereinafter, a digit line field) with the global magnetic field (B) generated by the first and the second magnets M1 and M2 (hereinafter, a global field). Also, each memory cell of the sample had the same structure as shown in FIG. 4. That is, a lower electrode and an upper electrode that generate local magnetic fields (hereinafter, a local field) are included in the memory cell. The MTJ cell of the memory cell had 0.3 μm×0.8 μm dimensions, and the lower electrode had a relatively large width of 1.12 μm.

The experiment was carried out under three different conditions: a local field condition, a local field and digit line field condition, and a local field and global field condition.

The switching characteristics of the magnetic memory samples will now be described.

Figure 5:
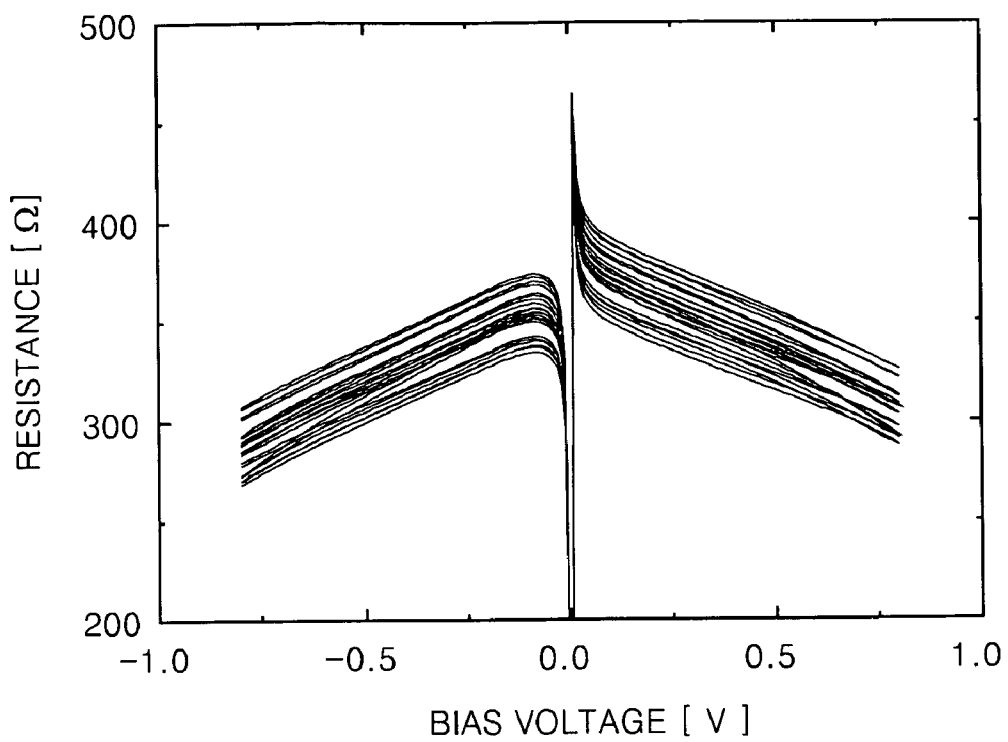
FIG. 5 is an example resistance-bias voltage graph showing a test result obtained by applying only a local field to a memory device with magnetic memory cells as depicted in FIG. 4.

FIG. 5 shows switching characteristics of the plurality of test samples under the first local field condition. Referring to FIG. 5, the resistances of the memory cells do not sharply change with respect to the bias voltage. This means that the magnetization orientation of a free magnetic layer of the MTJ cell 42 is not changed (switched) by the local field. That is, when the width of the lower electrode is relatively large, the magnetization orientation of the free magnetic layer is not switched only by the local field.

Figure 6:
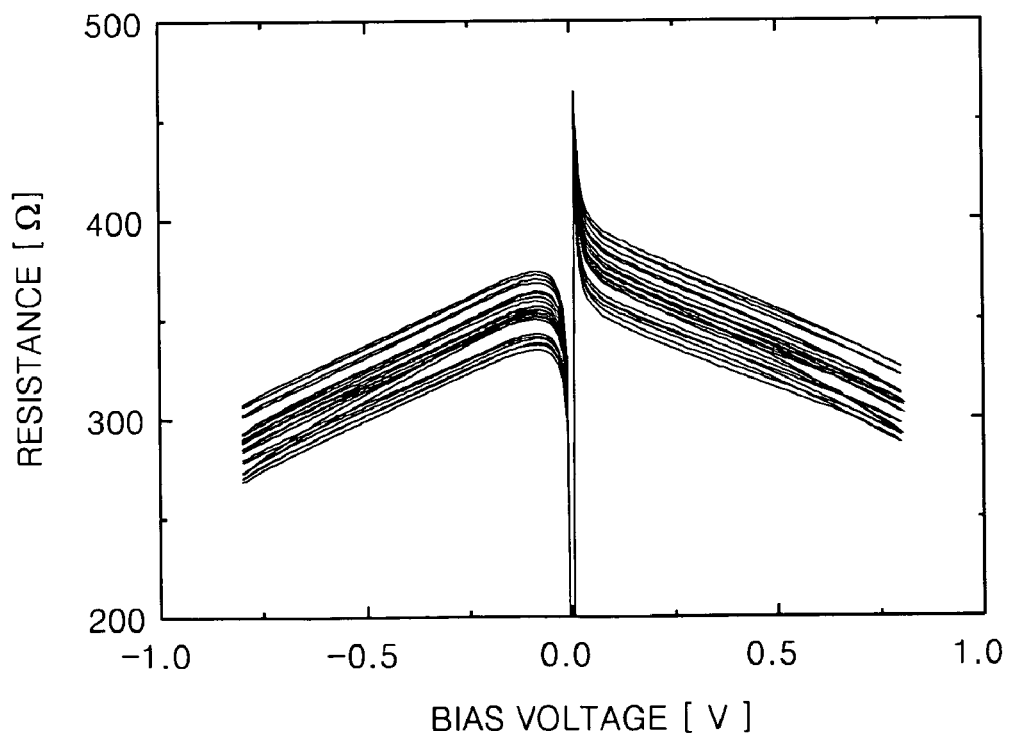
FIGS. 6 through 8 are example resistance-bias voltage graphs showing test results obtained by applying both a local field and a digit line magnetic field to a memory device with magnetic memory cells as depicted in FIG. 4.
Figure 7:
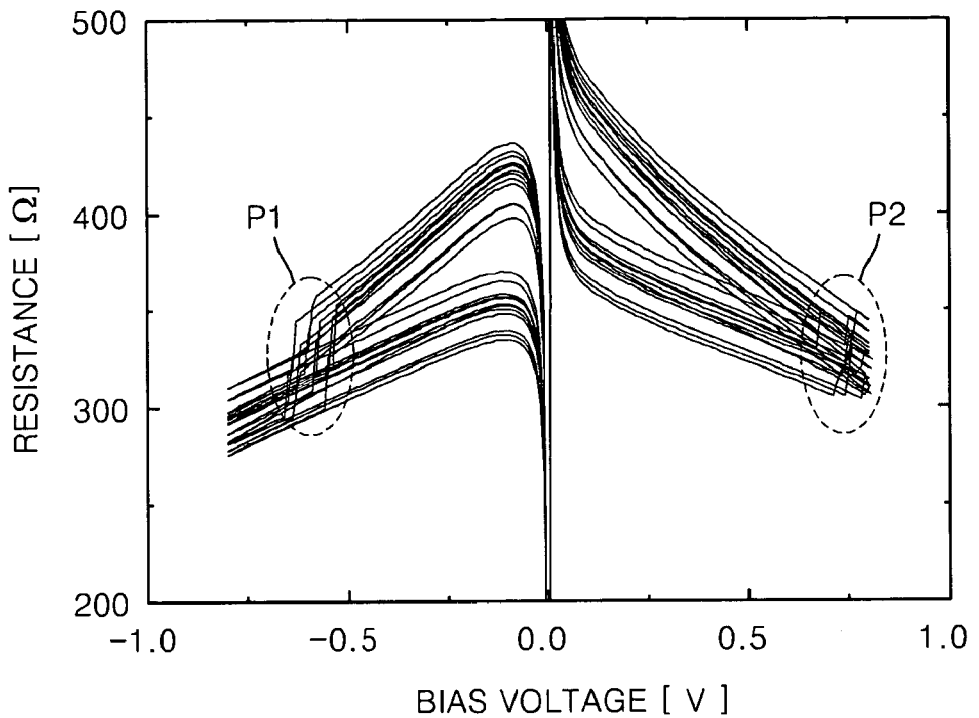
Figure 8:
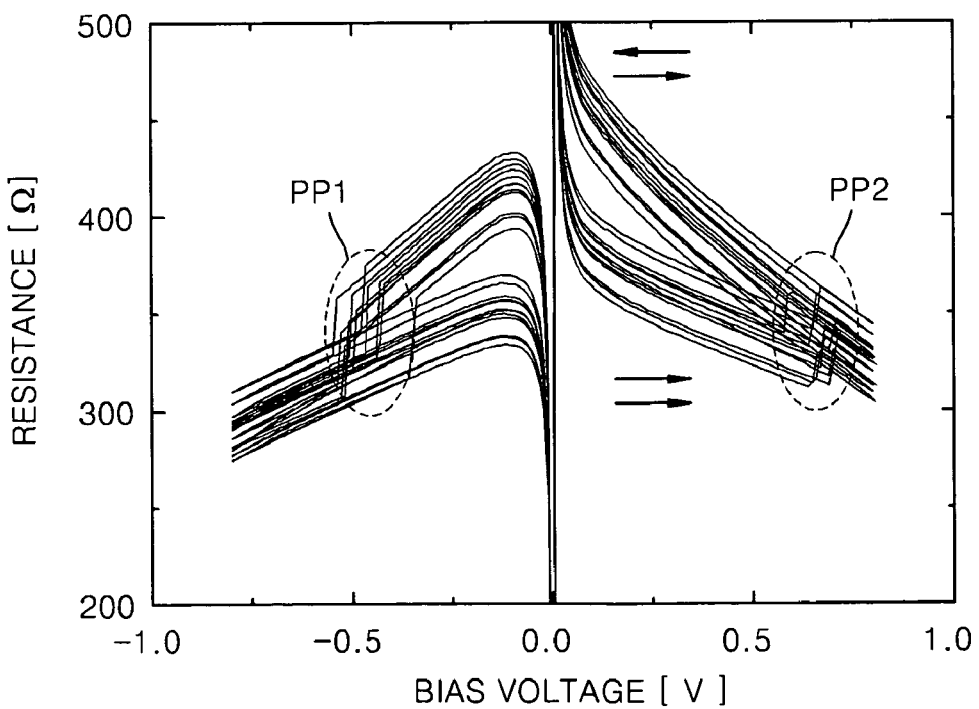

FIGS. 6 through 8 show switching characteristics of the plurality of test samples under a local field and digit line field condition.

In detail, FIG. 6 shows switching characteristics when no current is applied to the digit line (IDL=0), FIG. 7 shows switch characteristics when a current of 7.5 mA is applied to the digit line, and FIG. 8 shows switching characteristics when a current of 10 mA is applied to the digit line.

The curves in FIG. 6 show the same pattern as in FIG. 5. Since only the local field exists when no current is applied to the digit line, the same result is shown in FIG. 6. Referring to FIGS. 7 and 8, the resistances are changed sharply with respect to the bias voltage at four points P1, P2, PP1, and PP2. At these points P1, P2, PP1, and PP2, the resistances of the MTJ cells are sharply changed because the magnetization orientations of the free magnetic layers of the MTJ cells are reversed. That is, when the local field and the digit line field are applied at the same time, the magnetization orientation of the free magnetic layer may be switched.

When the points P1 and P2 in FIG. 7 are compared with the points PP1 and PP2 in FIG. 8, the bias voltages at the points PP1 and PP2 are closer to the zero-voltage line than the bias voltages at the points P1 and P2 because the magnetic field strength around the digit line increases in proportional to the current applied to the digit line. Referring to FIG. 8, parallel arrows pointing in the same direction are shown to denote that the lower electrode of the MTJ cell has the same magnetization orientation as the free magnetic layer of the MTJ cell (the MTJ cell is in a lower magnetic resistance state). On the contrary, upper parallel arrows pointing in opposite directions show that the magnetization orientations of the lower electrode and the free magnetic layer are anti-parallel (the MTJ cell is in a higher magnetic resistance state).

Figure 9:
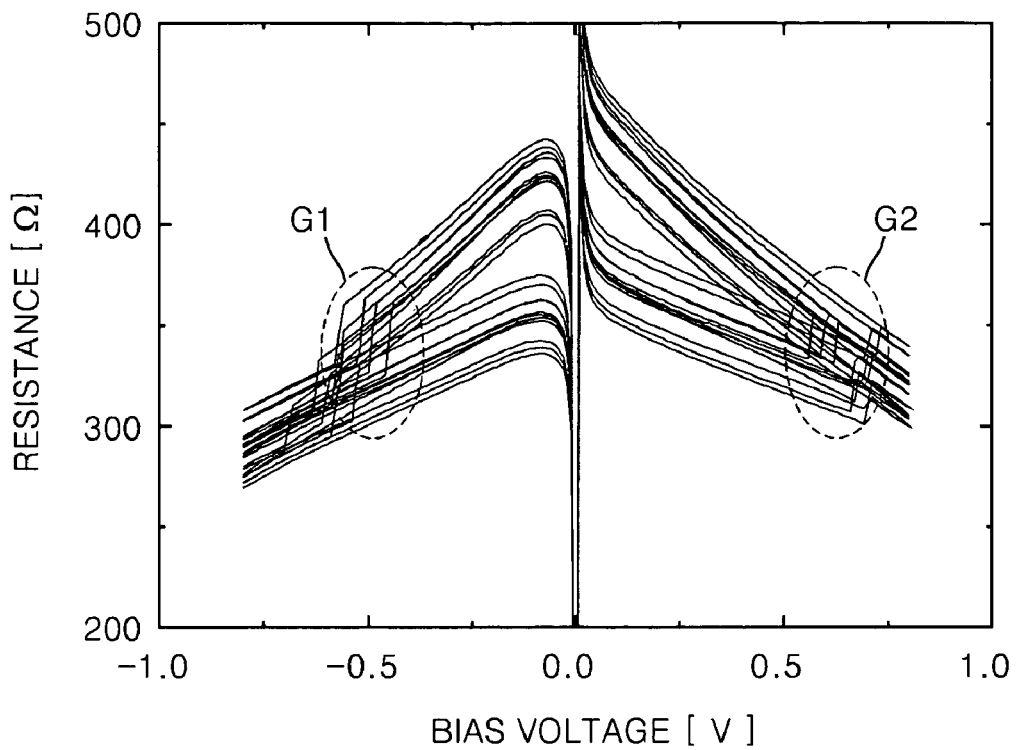
FIGS. 9 and 10 are example resistance-bias voltage graphs showing test results obtained by applying both a local field and a global magnetic field to a memory device with magnetic memory cells as depicted in FIG. 4.
Figure 10:
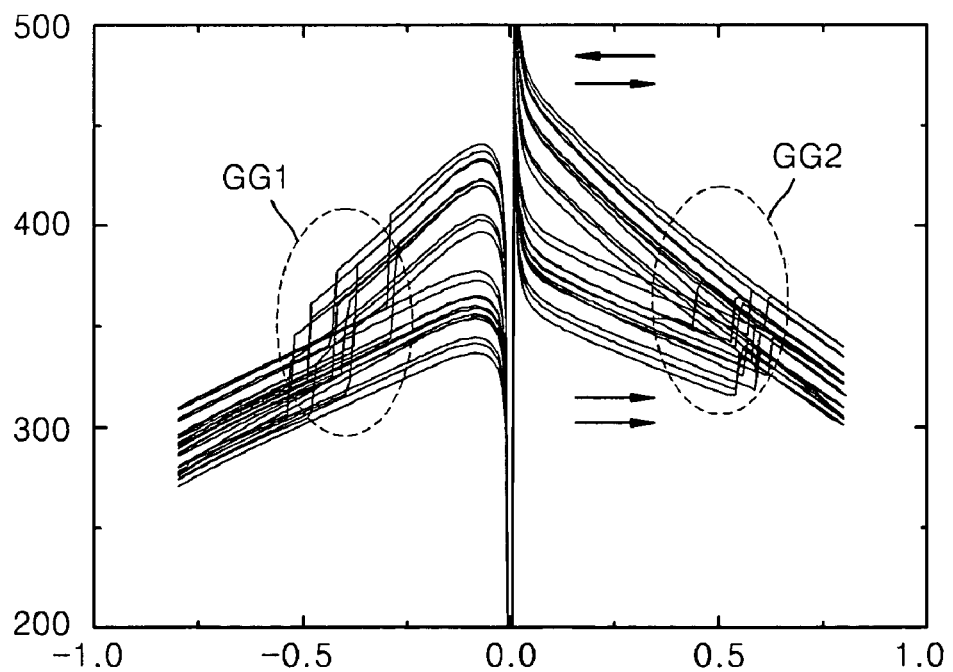

FIGS. 9 and 10 illustrate switching characteristics of the plurality of test samples under a local field and global field condition.

In detail, FIG. 9 shows switching characteristics when the global field is 30 Oersted (Oe), and FIG. 10 shows switching characteristics when the global field is 40 Oe.

Referring to FIGS. 9 and 10, the resistances are changed sharply at four points G1, G2, GG1, and GG2. That is, the magnetization orientation of the free magnetic layer is switched at the four points G1, G2, GG1, and GG2, and thereby the magnetic resistance of the MTJ cell is sharply changed at those points. The test results shown in FIGS. 9 and 10 show that the global field has the same effect as the digital line field. When the points GG1 and GG2 in FIG. 10 are compared with the points G1 and G2 in FIG. 9, the bias voltage at the points GG1 and GG2 are closer to the zero-voltage line than the bias voltages at the points G1 and G2. That is, the bias voltage, generating the local field, is lowered because the local field can be reduced by increasing the global field.

Operations of the memory device of example embodiments of the present invention will be described.

An operation of the memory device having the structure shown in FIGS. 1 and 3 will now be described.

<Write>

Figure 11:
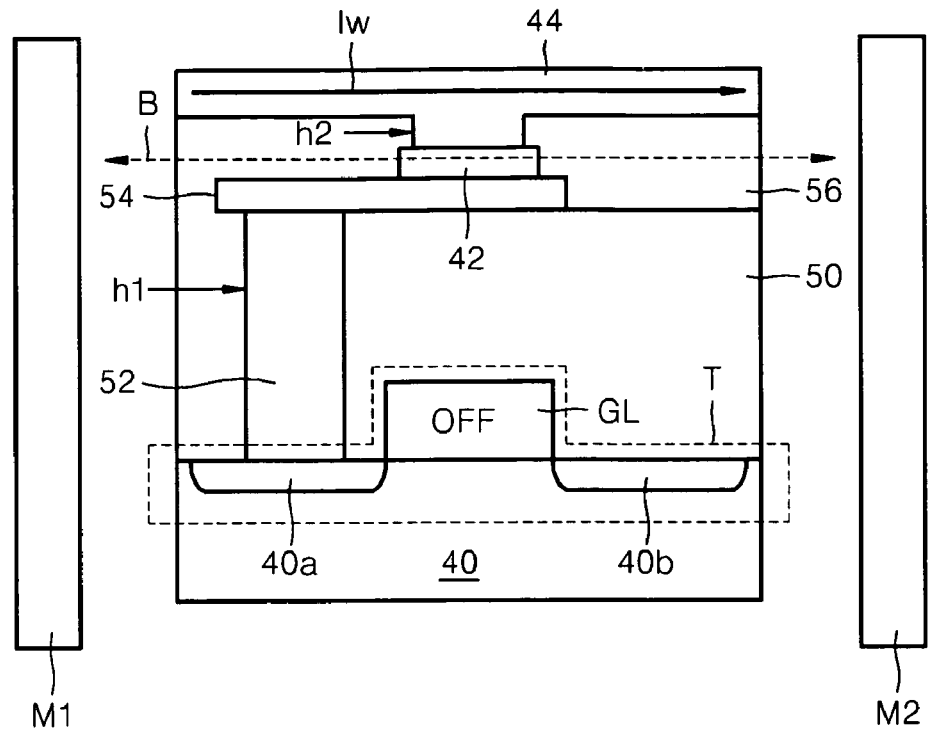
FIG. 11 is an example sectional view showing an operation of a memory device with the magnetic memory cell depicted in FIG. 3.

Referring to FIG. 11, the transistor (T) is kept in an off-state. A write current Iw may be applied to the bit line 44 under the global magnetic field (B) generated by the first and the second magnets M1 and M2 to generate a magnetic field around the bit line 44 in an easy axis direction. The magnetization orientation of the free magnetic layer (not show) of the MTJ cell 42 may be reversed by the combination of the bit line magnetic field and the global magnetic field (B). Thus, the magnetization orientation of the free magnetic field can be changed to have the same or the opposite orientation with respect to the fixed magnetization orientation of the lower electrode (not shown) of the MTJ cell 42. When the free magnetic layer and the lower electrode have the same magnetization orientation, it may be assumed that a "1" is written in the MTJ cell 42. When they have opposite magnetization orientations, it may be assumed that a "0" is written in the MTJ cell 42.

<Read>

The transistor (T) is kept in an on-state. A read voltage Vr may be applied to both ends of the MTJ cell 42 and the resulting current from the MTJ cell 42 is measured. The measured current may be compared with a reference current value of the MTJ cell to read data from the MTJ cell 42. If the measured current is lower than the reference current value, it may be assumed that a "0" is read from the MTJ cell 42, and if the measured current is higher than the reference current value, it may be assumed that a "1" is read from the MTJ cell 42.

An operation of the memory device having the structure shown in FIGS. 1 and 4 will now be described.

<Write>

Figure 12:
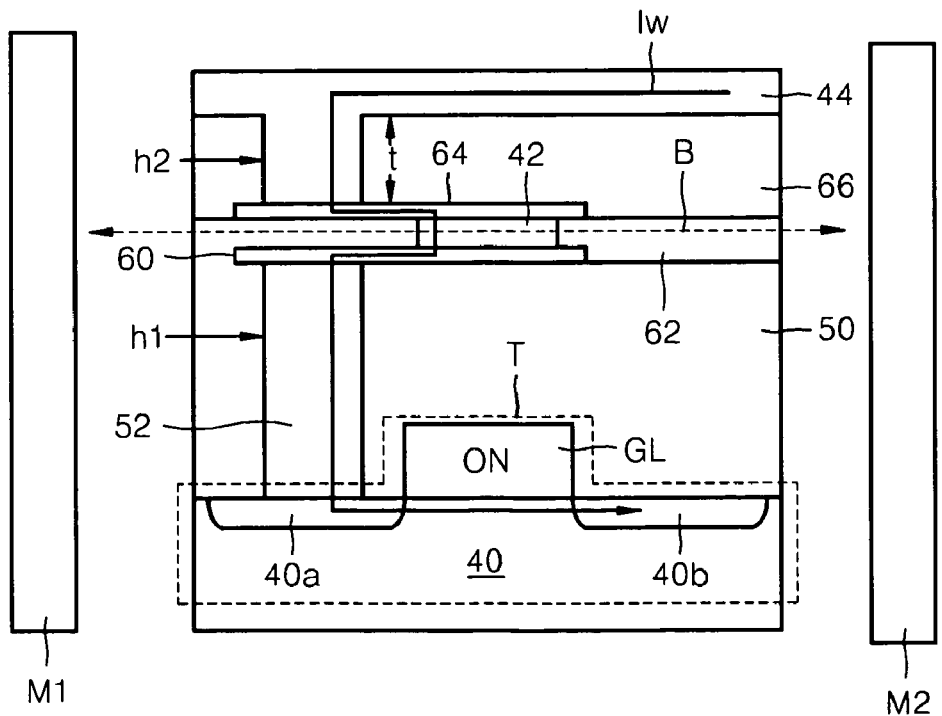
FIG. 12 is an example sectional view showing an operation of a memory device with the magnetic memory cell depicted in FIG. 4.

Referring to FIG. 12, the transistor (T) is kept in an on-state when the first and the second magnets M1 and M2 generate the global magnetic field (B) in a hard axis. A write voltage Vw is applied between the bit line 44 and the transistor (T) to generate a write current I'w from the bit line 44 to the transistor (T) through the upper electrode 64, the MTJ cell 42, the lower electrode 60, and the conductive plug 52. The direction of the write current I'w may be opposite to the direction shown in FIG. 12. The write current I'w may generate a local magnetic field around the upper electrode 64 and the lower electrode 60, and the magnetization orientation of the free magnetic layer of the MTJ cell 42 may be aligned along the local magnetic field. With this alignment, the magnetization orientation of the free magnetic field can be changed to have the same or the opposite orientation with respect to the fixed magnetization orientation of a pinned layer (not shown) of the MTJ cell 42. When the free magnetic layer and the pinned layer have the same magnetization orientation, it may be assumed that a "1" is written in the MTJ cell 41. When they have opposite magnetization orientations, it may be assumed that a "0" is written in the MTJ cell 41. Therefore, the MTJ cell 42 can store a single data bit. Because the write current I'w flows through the bit line 44, the bit line 44 generates a bit line magnetic field around it to affect the free magnetic layer of the MTJ cell 42. However, this bit line magnetic field may be ignored because the thickness of the bit line 44 is large and the distance (t) between the bit line 44 and the MTJ cell 42 is sufficiently large.

The direction of the local magnetic field may be reversed by changing the direction of the write current I'w, such that the magnetic orientation of the free magnetic layer may also be changed.

<Read>

The transistor (T) is kept in an on-state. A read voltage Vr may be applied between the upper electrode 64 and the lower electrode 60. The read voltage Vr may be smaller than the write voltage Vw applied between the upper electrode 64 and the lower electrode 60 to protect the MTJ cell 42 from data change or data destruction during a data read operation.

After the read voltage Vr is applied, a current passing through the MTJ cell 42 may be measured using a sensor (not show) connected to the second impurity doped region 40b of the transistor (T). The measured current may be compared with a reference current value of the MTJ cell to read data from the MTJ cell 42.

Methods of manufacturing the memory device of example embodiments of the present invention will be described below.

A method of manufacturing the magnetic memory cell depicted in FIG. 4 will now be described.

Figure 13:
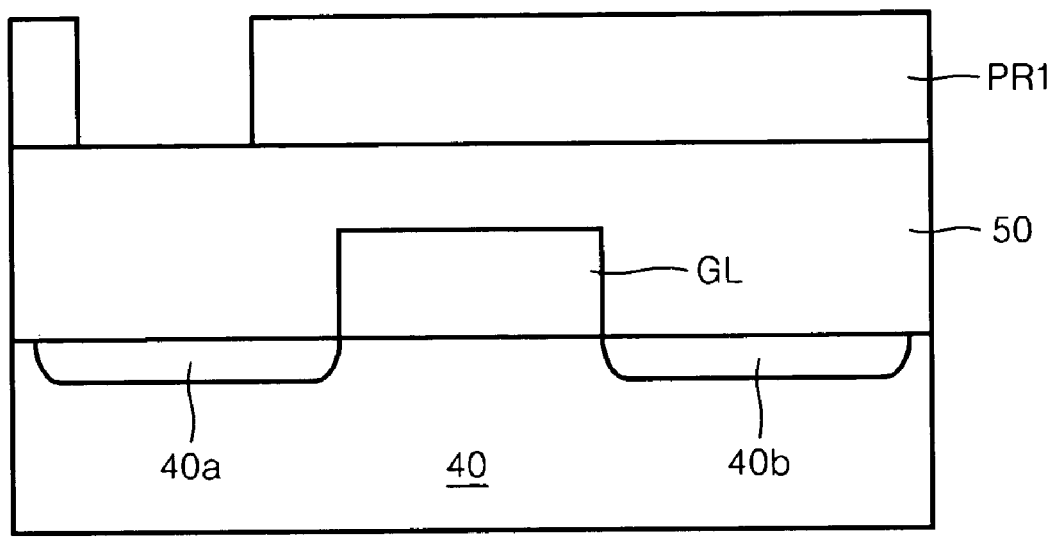
FIGS. 13 through 18 are example sectional views showing a method of manufacturing a memory device having the magnetic memory cell as depicted in FIG. 4.
Figure 14:
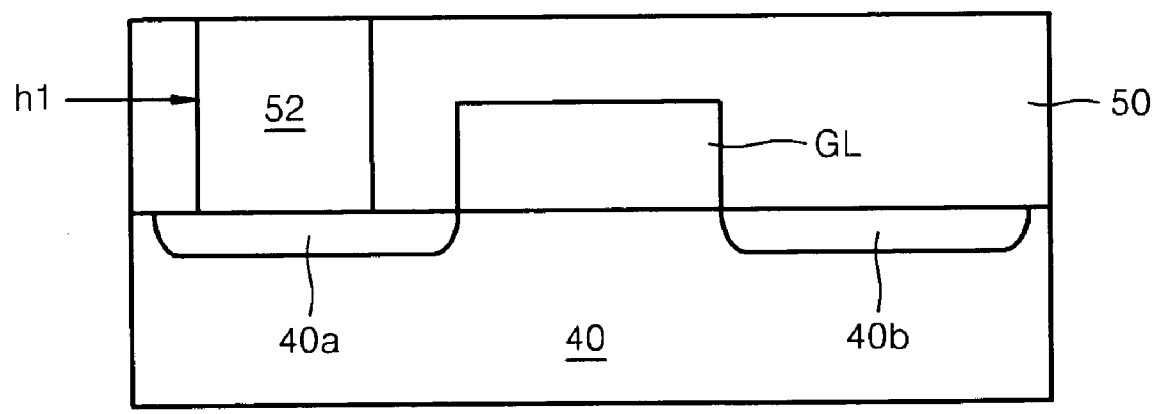

Referring to FIG. 13, a gate line GL is formed on a substrate 40. The substrate 40 may be a semiconductor substrate, for example, a p-type silicon substrate and an n-type silicon substrate. For example, the gate line GL may be formed as follows: a gate insulating layer may be formed on the whole surface of the substrate 40; a conductive layer may be formed on the gate insulating layer to use it as a gate electrode; a passivation layer may be formed on the conductive layer; a mask may be formed on the passivation layer to define the region of the gate line GL; these sequentially stacked layers may be etched in reverse order; and the mask may be removed. A spacer may be formed beside the gate line GL, (not shown in FIG. 13). After the gate line GL is formed, a first impurity doped region 40a and a second impurity doped region 40b may be formed at both sides of the gate line GL, for example, through an ion doping process). One of the first and the second impurity doped regions 40a and 40b may be used as a source region, and the other may be used as a drain region. In this way, a field effect transistor (T) is formed. An interlayer insulating layer 50 may be formed on the substrate 40 to cover the transistor (T), and a top surface of the interlayer insulating layer 50 may be planarized. A photoresist pattern PR1 may be formed on the interlayer insulating layer 50 to cover it entirely except a surface under which the first impurity doped region 40a is located. The exposed surface of the interlayer insulating layer 50 may be etched to expose the first impurity doped region 40a by using the photoresist pattern PR1 as an etching mask. The photoresist pattern PR1 may be removed after the etching. By etching, a contact hole h1 may be defined in the interlayer insulating layer 50 to expose the first impurity doped region 40a as shown in FIG. 14. The contact hole h1 may be filled with a conductive plug 52. After or before the conductive plug 52 is filled, an ohmic contact process may be performed.

Figure 15:
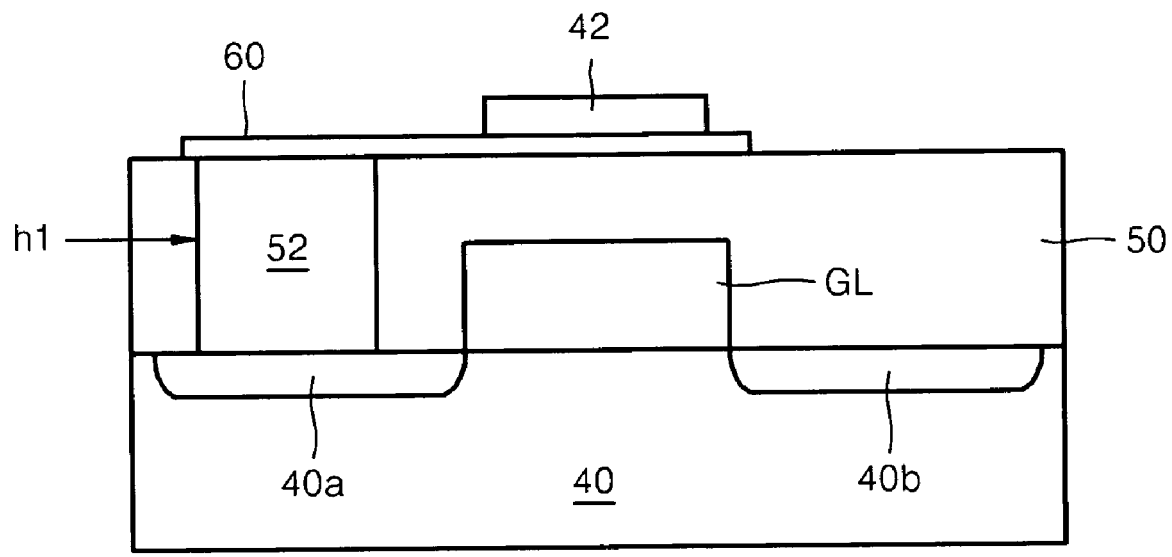

Referring to FIG. 15, a lower electrode 60 may be formed on the interlayer insulating layer 50. The lower electrode 60 may contact the conductive plug 52 and may extend over the gate line GL. The lower electrode 60 may be formed by patterning an electrode material through a photolithography and an etching process after forming the electrode material on the interlayer insulating layer 50. In an example embodiment, the lower electrode 60 may have a relatively thin thickness. For example, the lower electrode 60 may formed to have a thickness smaller than 100 nm. Reduction in thickness and width enables the lower electrode 60 to generate a more concentrated magnetic field toward an MTJ cell when a current is applied to the lower electrode 60. An MTJ cell 42 may be formed on a surface of the lower electrode 60. The MTJ cell 42 may include a pinning layer, a pinned layer, a tunneling layer, and/or a free magnetic layer. Because a MTJ cell is well known to those of ordinary skill in the art, detail descriptions for forming the MTJ cell will be omitted. The MTJ cell 42 may be formed on an end portion of the lower electrode 60 where the conductive plug 52 is spaced apart.

Figure 16:
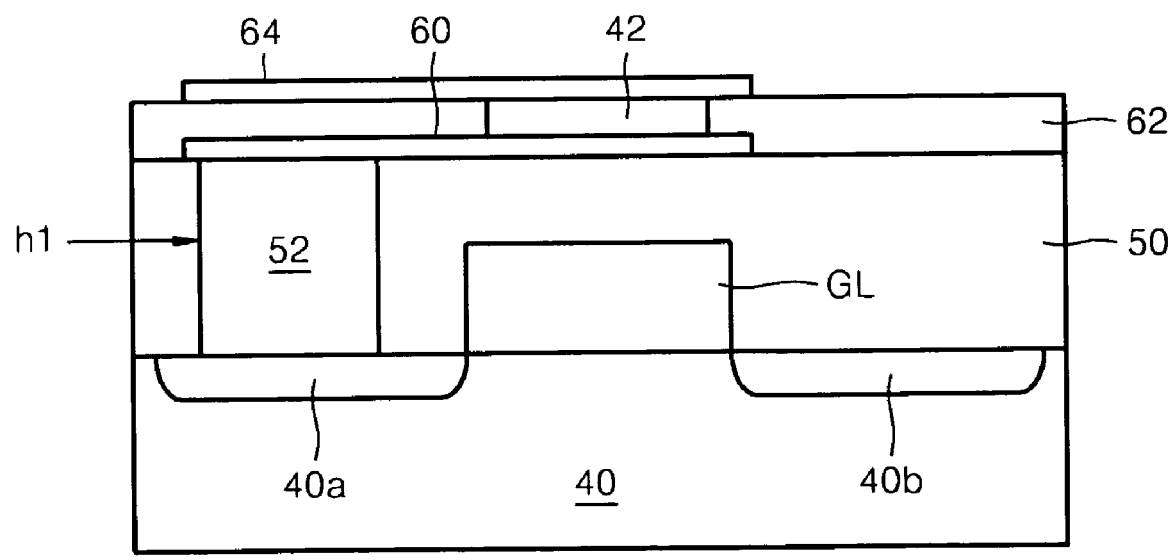

Referring to FIG. 16, a first insulating layer 62 may be formed on the interlayer insulating layer 50 to cover the lower electrode 60 and the MTJ cell 42. The first insulating layer 62 may be made of the same material as the interlayer insulating layer 50. The top of the first insulating layer 62 may be polished away until the MTJ cell 42 is exposed. An upper electrode 64 may be formed on the first insulating layer 62 to contact the exposed top surface of the MTJ cell 42. Because the upper electrode 64 may perform the same function as the lower electrode 60, the upper electrode 64 and the lower electrode 60 may be symmetrical with respect to the MTJ cell 42. The upper electrode 64 may be formed in the same manner as the lower electrode 60.

Figure 17:
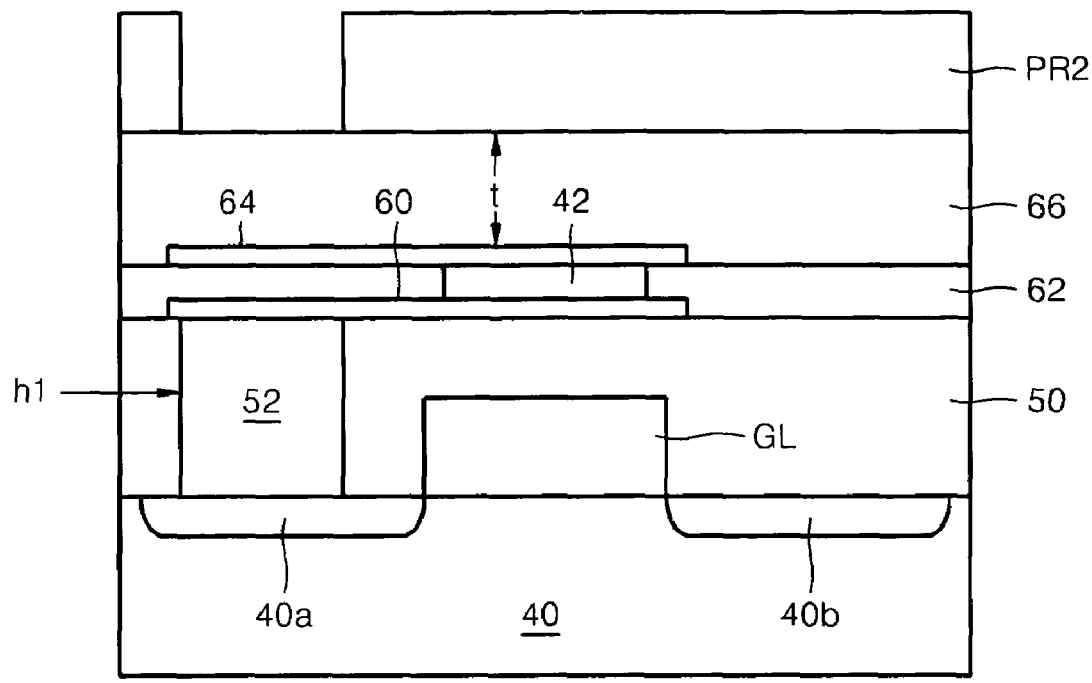
Figure 18:
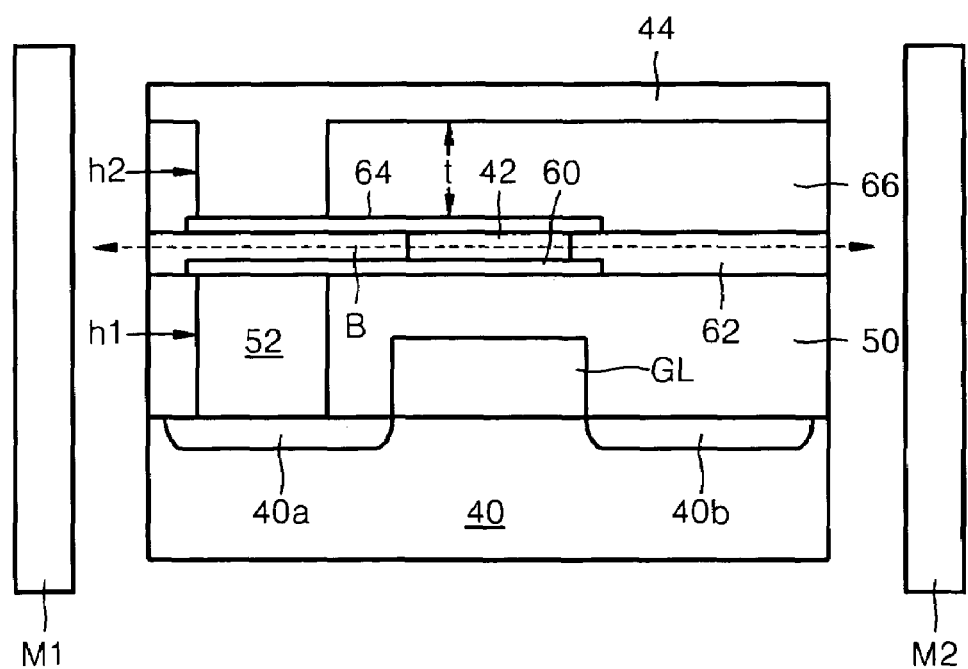

Referring to FIG. 17, a second insulating layer 66 may be formed on the first insulating layer 62 to cover the upper electrode 64. The second insulating layer 66 may be formed such that the distance (t) between top surfaces of the second insulating layer 66 and the upper electrode 64 may be maintained after completing the next etching process. For example, the distance (t) may be about 300 nm. The distance (t) may be changed depending on the magnetic field strength of a bit line (element 44 in FIG. 18). If the magnetic field of the bit line is strong enough to affect the magnetization orientation of the free magnetic layer of the MTJ cell 42, the distance (t) may be larger than 300 nm. If the bit line magnetic field is not strong enough, the distance (t) may be smaller than 300 nm. A photoresist pattern PR2 may be formed on the second insulating layer 66 to cover it entirely except for a surface under which conductive plug 52 is located. That is, the photoresist pattern PR2 may expose some portion of the second insulating layer 66. The exposed surface of the second insulating layer 66 may be etched to expose the upper electrode 64 using the photoresist pattern PR2 as an etching mask. The photoresist pattern PR2 may be removed after the etching. By etching, a via hole h2 may be defined in the second insulating layer 66 to expose the upper electrode 64 as shown in FIG. 18. After the via hole h2 may be formed, the bit line 44 may be formed on the second insulating layer 66 to fill the via hole h2 and make contact with the upper electrode 64. A first magnet M1 and a second magnet M2 may be disposed at both sides of the MTJ cell 42. The first and the second magnets M1 and M2 may face each other to generate a global magnetic field (B) in a parallel direction to the bit line 44. That is, the first and the second magnets M1 and M2 may be perpendicular to the bit line 44. The magnets M1 and M2 may be permanent magnets.

Though a plurality of memory cells D1 (cell array 100, in FIGS. 1 and 2) are interposed between the first magnet M1 and the second magnet M2, the plurality of memory cells D1 may be made at the same time during the same process. Therefore, for clarity reasons, the above description refers only to the manufacturing of only one memory cell D1 in the memory device. In FIGS. 13 through 18, for the same reason, only one memory cell D1 is shown between the first magnet M1 and the second magnet M2.

Further, the above example manufacturing method can be used for the memory cell of FIG. 3 if forming the upper electrode 64 is omitted and the via hole h2 is formed to expose the MTJ cell 42.

While the present invention has been particularly shown and described with reference to example embodiments thereof, it will be understood by those of ordinary skill in the art that various changes in form and details may be made therein without departing from the spirit and scope of the present invention. For example, one of the upper electrode and the lower electrode can be omitted. Also, a permanent magnet material can be formed around the MTJ cell. Therefore, the scope of the present invention is defined not by the detailed description of example embodiments of the present invention but by the appended claims.

As described above, the memory device of example embodiments of the present invention is provided with a magnetic field generating part disposed inside the memory device to generate the internal or the local magnetic field and another magnetic field generating part external to the memory device to generate the global magnetic field toward the memory device. The internal magnetic field generating part may be the bit line or the electrode pad formed on the MTJ cell. The external magnetic field generating part may be a permanent magnet pair capable of generating a sufficient magnetic field.

According to example embodiments of the present invention, power consumption of the memory device and/or sensor can be reduced. Also, both an increase of the coercivity when the integration of the device is high and the current when the integration of the device is low may be prevented.

What is claimed is:

1. A memory device comprising:
   a magnetic memory including an MTJ (magnetic tunneling junction) cell, a transistor, and a bit line; and
   a magnetic field generator external to the magnetic memory to generate a global magnetic field toward the magnetic memory in a parallel direction to the bit line, wherein the global magnetic field is used to write data.

2. The memory device of claim 1, wherein the magnetic memory includes a cell array with a plurality of magnetic memory cells that are connected by the bit line, each of the magnetic memory cells including the MTJ cell and the transistor.

3. The memory device of claim 2, wherein each of the magnetic memory cells further includes:
   a lower electrode connecting the MTJ cell with the transistor; and
   an upper electrode facing the lower electrode and connecting the MTJ cell with the bit line,
      wherein the MTJ cell is disposed between the lower and the upper electrodes, and the upper electrode connected to the bit line is spaced apart from the bit line such that a magnetic field generated from the bit line toward the MTJ cell is negligible.

4. The memory device of claim 1, wherein the magnetic field generator is perpendicular to the bit line and includes:
   a first magnet having a N-pole surface facing the magnetic memory; and
   a second magnet having an S-pole surface facing the magnetic memory, and wherein the second magnet faces the first magnet with the magnetic memory therebetween.

5. The memory device of claim 4, wherein the first and the second magnets are permanent magnets.

6. A method of operating a memory device that includes a magnetic memory and a magnetic field generator, the magnetic memory including an MTJ cell, a transistor, and a bit line, the magnetic field generator external to the magnetic memory to generate a magnetic field toward magnetic memory in a parallel direction to the bit line, the method comprising:
   writing data in the magnetic memory by applying a write current to a bit line when the magnetic memory is in a magnetic field generated by the magnetic field generator.

7. The method of claim 6, wherein the transistor is kept in an off-state.

8. The method of claim 6, wherein the magnetic memory includes a cell array with a plurality of magnetic memory cells that are connected by the bit line, each of the magnetic memory cells including the MTJ cell and the transistor.

9. The method of claim 8, wherein each of the magnetic memory cells further includes:
   a lower electrode connecting the MTJ cell with the transistor; and
   an upper electrode facing the lower electrode and connecting the MTJ cell with the bit line,
      wherein the MTJ cell is disposed between the lower and the upper electrodes, and the upper electrode connected to the bit line is spaced apart from the bit line such that a magnetic field generated from the bit line toward the MTJ cell is negligible.

10. The method of claim 9, wherein the transistor is kept in an on-state.

11. The method of claim 6, wherein the magnetic field generator is perpendicular to the bit line and includes:
    a first magnet having a N-pole surface facing the magnetic memory; and
    a second magnet having an S-pole surface facing the magnetic memory, and wherein the second magnet faces the first magnet with the magnetic memory therebetween.

12. The method of claim 11, wherein the first and the second magnets are permanent magnets.

13. A method of operating a memory device that includes a magnetic memory and a magnetic field generator, the magnetic memory including an MTJ cell, a transistor, and a bit line, the magnetic field generator external to the magnetic memory to generate a global magnetic field toward the magnetic memory in a parallel direction to the bit line, wherein the global magnetic field is used to write data, the method comprising:
    turning on the transistor; and
    applying a read current to the bit line to read data from the magnetic memory, the read current being smaller than a write current of the bit line.

14. The method of claim 13, wherein the magnetic memory includes a cell array with a plurality of magnetic memory cells that are connected by the bit line, each of the magnetic memory cells including the MTJ cell and the transistor.

15. The method of claim 14, wherein each of the magnetic memory cells further includes:

a lower electrode connecting the MTJ cell with the transistor; and an upper electrode facing the lower electrode and connecting the MTJ cell with the bit line, wherein the MTJ cell is disposed between the lower and the upper electrodes, and the upper electrode connected to the bit line is spaced apart from the bit line such that a magnetic field generated from the bit line toward the MTJ cell is negligible.

16. The method of claim 13, wherein the magnetic field generator is perpendicular to the bit line and includes:

a first magnet having a N-pole surface facing the magnetic memory; and a second magnet having an S-pole surface facing the magnetic memory, and wherein the second magnet faces the first magnet with the magnetic memory therebetween.

17. The method of claim 16, wherein the first and the second magnets are permanent magnets.

18. A method of manufacturing a memory device, comprising:

forming a transistor on a substrate;

forming an MTJ cell in connection with the transistor;

forming a bit line in connection with the MTJ cell; and disposing a magnetic field generator external to the MTJ cell to generate a global magnetic field that passes through the MTJ cell in a direction parallel to the bit line.

19. The method of claim 18, wherein the magnetic field generator is disposed at each side of the MTJ cell.

20. The method of claim 18, further comprising forming a lower electrode to connect the transistor with the MTJ cell and generate a local magnetic field for the MTJ cell.

21. The method of claim 18, further comprising forming an upper electrode to connect the bit line with the MTJ cell and generate a local magnetic field for the MTJ cell.

22. The method of claim 18, wherein the magnetic field generator is perpendicular to the bit line and includes:

a first magnet having a N-pole surface facing the magnetic memory; and a second magnet having an S-pole surface facing the magnetic memory, and wherein the second magnet faces the first magnet with the magnetic memory therebetween.

23. The memory device of claim 22, wherein the first and the second magnets are permanent magnets.

\* \* \* \* \*